(12) United States Patent
Onai

(10) Patent No.: US 9,403,967 B2
(45) Date of Patent: Aug. 2, 2016

(54) CURABLE RESIN COMPOSITION, CURED PRODUCT THEREOF AND PHOTOSEMICONDUCTOR APPARATUS

(71) Applicant: SHIN-ETSU CHEMICAL CO., LTD., Tokyo (JP)

(72) Inventor: Satoshi Onai, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 60 days.

(21) Appl. No.: 14/276,712

(22) Filed: May 13, 2014

(65) Prior Publication Data

US 2014/0339473 A1    Nov. 20, 2014

(30) Foreign Application Priority Data

May 14, 2013   (JP) ................................ 2013-101998

(51) Int. Cl.
*C08K 5/5419*    (2006.01)
*C09K 11/02*    (2006.01)

(52) U.S. Cl.
CPC ............. *C08K 5/5419* (2013.01); *C09K 11/025* (2013.01)

(58) Field of Classification Search
CPC ...... C08G 77/12; C08G 77/20; C08K 5/5419; C08L 63/00
See application file for complete search history.

(56) References Cited

U.S. PATENT DOCUMENTS

| | | | |
|---|---|---|---|
| 6,372,860 B1 * | 4/2002 | Miyoshi | ................. C08L 83/04 264/331.11 |
| 2004/0094757 A1 | 5/2004 | Braune et al. | |
| 2008/0160322 A1 | 7/2008 | Mochizuki et al. | |
| 2013/0069524 A1 | 3/2013 | Takai et al. | |

FOREIGN PATENT DOCUMENTS

| | | | |
|---|---|---|---|
| CN | 102893186 A | | 1/2013 |
| JP | A-2005-524737 | | 8/2005 |
| JP | 2006 339581 | * | 12/2006 |
| JP | 2010-018662 A | | 1/2010 |
| JP | 2010-285571 A | | 12/2010 |
| JP | B2-4591690 | | 12/2010 |
| JP | 2011-184625 A | | 9/2011 |
| JP | 2014-041985 A | | 3/2014 |
| WO | 2006/077667 A1 | | 7/2006 |

OTHER PUBLICATIONS

JP 2006 339581 machine translation (2006).*
Mar. 29, 2016 Office Action for Japanese Application No. 2013-101998.
May 16, 2016 Office Action issued in Chinese Application No. 201410204023.4.

* cited by examiner

*Primary Examiner* — Kuo-Liang Peng
(74) *Attorney, Agent, or Firm* — Oliff PLC

(57) ABSTRACT

The invention provides a curable resin composition which comprising: 100 parts by mass of a main component (X) (a refractive index: $RI_X$) containing at least one of a silicone resin, a modified silicone resin, an epoxy resin and a modified epoxy resin, and exceeding 0 part by mass and 100 parts by mass or less of an additive (Y) (a refractive index: $RI_Y$) containing at least one of a silicone resin, a modified silicone resin, an epoxy resin and a modified epoxy resin, and having a different refractive index as that of the main component (X) being added and dispersed therein, wherein the difference of the refractive indexes of the main component (X) and the additive (Y) being $|RI_X - RI_Y| \geq 0.0050$ in an uncured state.

19 Claims, 1 Drawing Sheet

CURABLE RESIN COMPOSITION, CURED PRODUCT THEREOF AND PHOTOSEMICONDUCTOR APPARATUS

BACKGROUND OF THE INVENTION

1. Field of the Invention

The present invention relates to a curable resin composition, a cured product thereof and a photosemiconductor apparatus useful as a material for optical devices and optical parts, an insulating material for electronic devices and electronical parts, and a coating material, etc.

2. Description of the Related Art

In general, a photosemiconductor apparatus typified by an LED (light-emitting diode) has characteristics that it has low electric power consumption and long lifetime, so that it has been used in a wide range of applications such as backlight for a mobile phone, backlight for liquid crystal television, lighting for automobile, lighting equipments and sign, etc.

In general, light emitting characteristics of a photosemiconductor apparatus is determined by a combination of the photosemiconductor device and light wavelength conversion material (in the following, it is referred to as "phosphor") to be added and dispersed in the encapsulant thereof, and it is possible to obtain a photosemiconductor apparatus having a color rendering property with various purposes depending on a weight ratio of the phosphor to be mixed. However, for manufacturing such a photosemiconductor apparatus, it was difficult to prepare a light emitting apparatus having stable color rendering property continuously.

In a specific example, it has been manufactured by filling an encapsulant in which a phosphor has been added to a curable resin composition having high transparency into a package substrate having a concave shape to which photosemiconductor devices have been mounted and wire bonded, by using a dispenser with a predetermined amount, and then, curing the same. In this process, the added phosphor has larger specific gravity as compared with that of the curable resin composition, so that the encapsulant is sedimented due to its own weight at the bottom of the filled apparatus with a lapse of time.

The above can be easily understood since the general phosphor is a material having a density of about 4 to 6 g/cm$^3$ and an average particle diameter of 20 µm or less, while the curable resin composition has a density of about 1 g/cm$^3$, so that the phosphor is sedimented during the encapsulating process in the manufacturing process with a lapse of time.

Accordingly, when an encapsulant in which a phosphor has been mixed is to be filled in a package substrate by using a dispenser, a dispersed state of the phosphor is changed at the initial stage of the manufacturing and at the latter stage of the same in a syringe attached to the apparatus, and a phenomenon occurs that at the initial stage of the manufacturing, a phosphor content in the encapsulant is large, while at the latter stage of the manufacturing, a phosphor content in the encapsulant is small. Whether the phosphor content is large or small is directly related to an amount of light to be light-converted, so that the problem occurs that the color rendering property initially designed is fluctuated, and a product having stable characteristics cannot be obtained.

Further, in the encapsulant to which a phosphor has been added, which is dispensed to a package substrate with a concave shape, sedimentation of the phosphor proceeds at the time of waiting curing by heating, so that a phenomenon occurs that in the package substrate at the initial stage of the manufacture, the phosphor is sedimented, but at the latter stage of the manufacture, the phosphor is not sedimented.

Such a concentration difference of the phosphor at the existing positions in the inside of the package substrate is directly related to an amount of light to be light-converted similarly as mentioned above, so that the problem occurs that the color rendering property initially designed is fluctuated, and a product having stable characteristics cannot be obtained.

As an example which can solve the problems, in Patent Document 1, silicone rubber spherical fine particles having an average particle diameter of 0.1 to 100 µm are added to a thermosetting resin composition. However, according to this method, the silicone rubber spherical fine particles themselves, and a surface treatment component, etc., are inferior in heat resistance and light resistance in many cases, so that the problems are remained. Further, in Patent Document 2, it has been proposed a method of preventing from sedimentation of the phosphor by the method that nanoparticles having an average particle diameter of 1 nm or more and 25 nm or less are dispersed in a nano state.

However, these methods which have been proposed as mentioned above each comprise adding a filler to an encapsulant and dispersing therein, so that the problems still remain that the designed color rendering property is fluctuated due to secondary aggregated particles of the filler and the phosphor, and a product having stable characteristics cannot be obtained.

Further, the problems of discoloration of the filler itself and discoloration due to moisture absorption at the interface between the encapsulant and the filler, etc., occur, so that it has been desired to develop a technique which is capable of preventing from sedimentation of the phosphor without using the filler.

That is, it has been desired to develop a curable resin composition for a photosemiconductor apparatus, which causes no change in a dispersed state of the phosphor at the initial stage of the manufacturing and at the latter stage of the same in a syringe of a dispenser or in a package substrate when the encapsulant to which the phosphor has been dispersed is filled in the package substrate, contains the same amount of the phosphor at the initial stage of the manufacturing and at the latter stage of the same, and can maintain stable brightness and color rendering property.

PRIOR ART REFERENCES

Patent Documents

Patent Document 1: Japanese Patent No. 4591690
Patent Document 2: Japanese Patent Laid-Open Publication No. 2005-524737

SUMMARY OF THE INVENTION

The present invention has been done in view of the problems, and an object thereof is to provide a curable resin composition, a cured product thereof and a photosemiconductor apparatus, which causes no change in a dispersed state of the phosphor at the initial stage of the manufacturing and at the latter stage of the same in a syringe of a dispenser or in a package substrate when the encapsulant to which the phosphor has been dispersed is filled in the package substrate, more specifically, contains the same amount of the phosphor at the initial stage of the manufacturing and at the latter stage of the same, and can maintain brightness and color rendering property stably.

To solve the problems, in the present invention, it is provided a curable resin composition which comprising:

100 parts by mass of a main component (X) (a refractive index: $RI_X$) containing at least one of a silicone resin, a modified silicone resin, an epoxy resin and a modified epoxy resin, and exceeding 0 part by mass and 100 parts by mass or less of an additive (Y) (a refractive index: $RI_Y$) containing at least one of a silicone resin, a modified silicone resin, an epoxy resin and a modified epoxy resin, and having a different refractive index as that of the main component (X) being added and dispersed therein, wherein the difference of the refractive indexes of the main component (X) and the additive (Y) being $|RI_X–RI_Y|≥0.0050$ in an uncured state.

When such a curable resin composition is employed, even if a filler is not used, when an encapsulant into which a phosphor has been dispersed is filled in a package substrate, a curable resin composition which contains the same amount of the phosphor at the initial stage of the manufacturing and at the latter stage of the same, and can maintain brightness and color rendering property stably can be provided.

Also, it is preferred that the additive (Y) contained in the curable resin composition is dispersed in the main component (X) in the state of fine particles, and the particle size is less than 50 µm.

Thus, if the particle size is less than 50 µm, effects of difficultly causing aggregation of the particles and sufficiently preventing sedimentation of the phosphor can be obtained, whereby an amount of the phosphor in the encapsulant can be made uniform.

Further, it is preferred that the curable resin composition is made a cured product with a thickness of 2 mm, its haze value is 1.0 or more, and an appearance thereof is from semi-transparent to cloudiness.

When such a haze value and appearance are possessed, an effect of preventing sedimentation can be surely obtained.

Also, it is preferred that the main component (X) is a silicone resin and the silicone resin comprises:

(A) an organopolysiloxane having two or more aliphatic unsaturated bonds in one molecule and being a linear, (B) an organopolysiloxane having two or more aliphatic unsaturated bonds in one molecule and having a resinous structure, (C) an organohydrogenpolysiloxane having two or more hydrogen atom bonded to a silicon atom in one molecule, and (D) a platinum group metal catalyst.

When such a silicone resin is employed, it is preferred in the viewpoints of transparency, heat resistance and light resistance.

Moreover, it is preferred that the additive (Y) is a silicone resin and the silicone resin comprises one or more components of:

(A) an organopolysiloxane having two or more aliphatic unsaturated bonds in one molecule and being a linear, (B) an organopolysiloxane having two or more aliphatic unsaturated bonds in one molecule and having a resinous structure, and (C) an organohydrogenpolysiloxane having two or more hydrogen atom bonded to a silicon atom in one molecule.

When such a silicone resin is employed, it is preferred in the viewpoints of transparency, heat resistance and light resistance.

Further, it is preferred that phosphor particles are added to the curable resin composition.

When such a curable resin composition is employed, it is useful for a photosemiconductor apparatus.

Furthermore, it is preferred that the curable resin composition does not contain any filler.

When such a curable resin composition is employed, even when no filler is contained, fluctuation of color rendering property can be prevented and a product having stable characteristics can be obtained.

Also, in the present invention, it is provided a cured product which comprises the curable resin composition being cured.

When such a cured product is employed, it is effective for preventing from sedimentation of the phosphor, in particular, it contains the same amount of the phosphor at the initial stage of the manufacturing and at the latter stage of the same in the dispensing process whereby it is excellent in stability of brightness and color rendering property.

Further, in the present invention, it is provided a photosemiconductor apparatus using a cured product of the curable resin composition.

When such a photosemiconductor apparatus is employed, brightness and color rendering property can be stably maintained.

As explained above, according to the present invention, it can be provided a curable resin composition in which, even if a filler is not used, when an encapsulant into which a phosphor has been dispersed is filled in a package substrate, there is no change in the dispersing states of the phosphor in a syringe of a dispenser or in a package substrate at the initial stage of the manufacturing and at the latter stage of the same, specifically the same amount of the phosphor is contained at the initial stage of the manufacturing and at the latter stage of the same, whereby it can maintain brightness and color rendering property stably, so that it is useful as materials for a cured product thereof and a photosemiconductor apparatus.

DETAILED DESCRIPTION OF THE PREFERRED EMBODIMENTS

Figure 1:
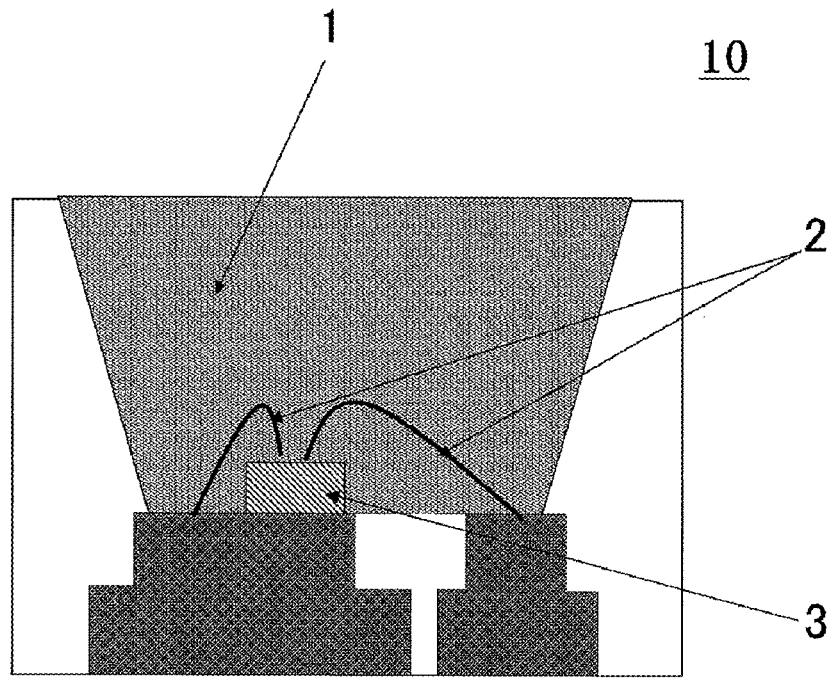
FIG. 1: a schematic sectional view showing an example of the photosemiconductor apparatus of the present invention.

In the following, the present invention is explained in more detail.

As mentioned above, it has been demanded to develop a curable resin composition, a cured product thereof and a photosemiconductor apparatus, in which they do not use a filler as in the conventional encapsulant, when an encapsulant into which a phosphor has been dispersed is filled in a package substrate, there is no change in the dispersing states of the phosphor in a syringe of a dispenser or in a package substrate at the initial stage of the manufacturing and at the latter stage of the same, specifically the same amount of the phosphor is contained at the initial stage of the manufacturing and at the latter stage of the same, whereby it can maintain brightness and color rendering property stably.

Thus, the present inventors have earnestly studied to solve the problems, and as a result, they have found that if a curable resin composition which comprising:

100 parts by mass of a main component (X) (a refractive index: $RI_X$) containing at least one of a silicone resin, a modified silicone resin, an epoxy resin and a modified epoxy resin, and exceeding 0 part by mass and 100 parts by mass or less of an additive (Y) (a refractive index: $RI_Y$) containing at least one of a silicone resin, a modified silicone resin, an epoxy resin and a modified epoxy resin, and having a different refractive index as that of the main component (X) being added and dispersed therein, wherein the difference of the refractive indexes of the main component (X) and the additive (Y) being satisfied the formula $|RI_X-RI_Y|\geq 0.0050$ in an uncured state, in particular, the additive (Y) being present by dispersing in the main component (X) in the state of fine particles with the particle size of less than 50 µm, further the curable resin composition has a haze value of 1.0 or more when the resin composition is made a cured product with a thickness of 2 mm, and having an appearance of from semi-transparent to which opaque is employed, without using a filler as in the conventional encapsulant, it causes no change in a dispersed state of the phosphor at the initial stage of the manufacturing and at the latter stage of the same in a syringe of a dispenser or in a package substrate when the encapsulant to which the phosphor has been dispersed is filled in the package substrate, more specifically, contains the same amount of the phosphor at the initial stage of the manufacturing and at the latter stage of the same, and can maintain brightness and color rendering property stably, whereby the present invention has been accomplished.

In the following, the present invention is explained in detail, but the present invention is not limited by these.

The present invention is directed to a curable resin composition which comprising:

100 parts by mass of a main component (X) (a refractive index: $RI_X$) containing at least one of a silicone resin, a modified silicone resin, and exceeding 0 part by mass and 100 parts by mass or less of an additive (Y) (a refractive index: $RI_Y$) containing at least one of a silicone resin, a modified silicone resin, an epoxy resin and a modified epoxy resin, and having a different refractive index as that of the main component (X) being added and dispersed therein, wherein the difference of the refractive indexes of the main component (X) and the additive (Y) being $|RI_X-RI_Y|\geq 0.0050$ in an uncured state.

That is, the present invention is directed to a curable resin composition in which the additive (Y) is added and dispersed in the main component (X), the main component (X) and the additive (Y) have different refractive indexes from each other, and in the added and dispersed, and uncured state, it does not uniformly dissolved and becomes a state from semi-transparent to slightly cloudiness, i.e., the transmitted light is in a scattered state, and thus, the composition after mixing becomes the so-called O/O type emulsion. As can be understood from the knowledge of the general emulsion product, in the curable resin composition of the present invention, the additive (Y) which is a small amount of added component becomes fine particulate state liquid drops and floating in the main component (X) in the state that it is uniformly dispersed with a certain range of the particle size. The fine particles in such a state can effectively inhibit the force of moving the phosphor according to the gravity, and sedimentation can be prevented. According to this matter, even when the dispensing process is performed for a long period of time, it is possible to make the phosphor amount in the LED apparatus substantially the same at the initial stage of the dispensing and the latter stage of the same, and accordingly, handling property of the encapsulant can be heightened.

Next, the difference of the refractive indexes of the main component (X) and the additive (Y) satisfies the formula $|RI_X-RI_Y|\geq 0.0050$ where the refractive index of the main component (X) is made $RI_X$ and that of the additive (Y) having a different refractive index is made $RI_Y$. Incidentally, it is preferably $|RI_X-RI_Y|\geq 0.0100$. The refractive index of a liquid, "nd25", may be measured by using a usual Abbe's refractometer, and the measurement accuracy may be sufficient with a refractive index (nD)±0.0002 or so.

The upper limit of $|RI_X-RI_Y|$ is not particularly limited so long as the additive (Y) is dispersed in the main component (X) in the state of fine particles with the particle size of less than 50 µm, further the curable resin composition has a haze value of 1.0 or more when the resin composition is made a cured product with a thickness of 2 mm, and accordingly, has an appearance of from semi-transparent to white opaque, and it is preferably $0.2000\geq |RI_X-RI_Y|$. If it is 0.2000 or less, there is no case that a lot of particles having 50 µm or more are present due to difference in refractive indexes is too large as mentioned later, and there is no case where a good dispersed state cannot be obtained that the dispersed state becomes unstable by aggregation of the particles, or floating or sedimentation occurs due to large difference in specific gravities of the particles, so that handling property as the curable resin composition is improved.

If $|RI_X-RI_Y|$ is less than 0.0050, it is not preferred since difference in refractive indexes is too small, so that the additive (Y) cannot exist as fine particles, whereby it becomes a uniformly dissolved resin composition and the effect of preventing from sedimentation of the phosphor can be difficultly obtained.

Further, the additive (Y) is preferably present by dispersing in the main component (X) with the state of fine particles having a particle size of less than 50 µm, in an uncured state. It is more preferably 30 µm or less. If the particle size is less than 50 µm, it is preferred since there is no fear of easily causing aggregation of particles, or growing as larger sized particles to lead separation of the resin composition with a lapse of time.

Also, if the particle size is less than 50 µm, it is preferred since the effect of preventing from sedimentation of the phosphor is shown sufficiently, and there is no fear of causing inconveniences that a phosphor amount in the encapsulating component is more fluctuated, etc.

A specific measurement method of the particle size is not particularly limited, and may be, for example, directly observed by an optical microscope or a laser microscope, etc., or may be a measurement method using a spectroscopic means such as a dynamic light scattering measuring device, etc. A suitable method may be selected depending on an appearance, a viscosity, a dispersed state of the obtained curable resin composition, and above all, a method of directly observed by a laser microscope is simple and easy, and a wide range of the compositions can be measured so that it is suitable.

As a method for obtaining a curable resin composition in which the additive (Y) is present in the main component (X) as fine particles of the present invention, it can be obtained by combining the main component (X) and the additive (Y) which satisfy their difference in the refractive indexes mentioned above of the formula $|RI_X-RI_Y|\geq 0.0050$ in an uncured state, and by adding and dispersing these materials. The methods of dispersing and adding the main component (X) and the additive (Y) are not particularly limited, and the conventionally known method can be used.

For example, there may be mentioned a mixing by using various types of mixers, a mixing by using a rotation/revolution-type centrifugal mixer, mixing and kneading using rollers, etc. At the time of stirring, inside of the stirring system may be made vacuum for the purpose of degassing. As an object to exist the additive (Y) as stable fine particles, it is preferably used an apparatus which can stir the materials by applying high speed and high shear as much as possible. It is preferably a mixing by a rotation/revolution-type centrifugal mixer equipped with a simple and easy evacuating function.

A formulation ratio of the main component (X) and the additive (Y) is preferably 100 parts by mass or less of the additive (Y) based on 100 parts by mass of the main component (X), more preferably 20 parts by mass or less. If the amount of the additive (Y) to be added exceeds 100 parts by mass, a number of the fine particles in the system increases, so that aggregation and bonding of the fine particles proceed, which may cause to form particles having 50 μm or more. A lower limit of the added amount is not particularly limited so long as the effect of preventing from sedimentation of the phosphor can be obtained, and it may be an amount exceeding 0 part by mass.

Further, the curable resin composition of the present invention has a characteristic when the resin composition is cured to prepare a product with a thickness of 2 mm, a haze value of the cured product is 1.0 or more. As can be understood that the haze value is defined by (haze value)=(diffused light transmittance)/(total light transmittance), the haze value is increased by increment of the diffused light component and decrease in the total light transmittance, which leads to semi-transparent to slightly cloudiness and further reaches to cloudiness.

The curable resin composition of the present invention preferably has a haze value when the resin composition is made a cured product with a thickness of 2 mm of 1.0 or more, which means that the cured product has transparent to a cloudiness state of semi-transparent or more. If the haze value is less than 1.0, the cured product is transparent, which means that less fine particles which scatter the light are present. As mentioned above, when the haze value is 1.0 or more, it is preferred since the effect of preventing from sedimentation of the phosphor can be obtained, and there is no fear of causing inconvenience that the phosphor amount in the encapsulant is more fluctuated, etc.

The upper value of the haze value is not particularly limited, and may be optionally adjusted depending on preventing from sedimentation of the phosphor and a light extraction efficiency of the objective LED apparatus. If it is smaller than 100, it is preferred since a ratio of rectilinear light component becomes low and it does not becomes an obstacle of light extraction from an LED apparatus.

The main component (X) and the additive (Y) are each characterized in that they are at least one selected from a silicone resin, a modified silicone resin, an epoxy resin and a modified epoxy resin. When the formula: $|RI_X - RI_Y| \geq 0.0050$ is satisfied, a different resin series may be selected and used.

The main component (X) and the additive (Y) may be each selected optional resin or composition having the objective physical properties and the refractive index, and two or more kinds may be optionally used in combination. The curable resin composition of the present invention is preferably a silicone resin or a modified silicone resin in the viewpoints of transparency, heat resistance and light resistance.

The resin preferably has a viscosity at room temperature of 100 mPa·s or more and 10,000 mPa·s or less, more preferably 100 mPa·s or more and 5,000 mPa·s or less. If the viscosity is 100 mPa·s or more, even when fine particles are present in the curable resin composition, an effect of preventing from sedimentation of the phosphor can be obtained as a whole, whereby color fluctuation can be improved. If it is 10,000 mPa·s or less, it is preferred since the viscosity of the encapsulant does not become not too high, and there is no fear of causing inconvenience in the dispensing process, specifically lowering in workability due to decrease in velocity at the time of discharging a high viscosity liquid, fluctuation in a filling amount of the encapsulant due to cobwebbing of the encapsulant, and occurrence of contamination of the apparatus, etc.

Further, the refractive index can be suitably adjusted by changing an amount of a functional group-containing amount in the resin constituting the respective resins, for example, a kind or an amount of a monovalent hydrocarbon group (there may be mentioned a group preferably having 1 to 10 carbon atoms, particularly having 1 to 6 carbon atoms, specifically an alkyl group such as methyl group, ethyl group, propyl group, isopropyl group, butyl group, isobutyl group, tert-butyl group, pentyl group, neopentyl group, hexyl group, octyl group, nonyl group, decyl group; a cyclohexyl group; an aryl group such as phenyl group, tolyl group, xylyl group, naphthyl group; an aralkyl group such as benzyl group, phenylethyl group, phenylpropyl group; an alkenyl group such as vinyl group, allyl group, propenyl group, isopropenyl group, butenyl group, pentenyl group, hexenyl group, octenyl group; a cyclohexenyl group; and a group in which a part or whole of the hydrogen atom(s) of these hydrocarbon group has/have been substituted by a halogen atom such as fluorine, bromine, chlorine; a cyano group, and the like, for example, a halogen-substituted alkyl group such as chloromethyl group, chloropropyl group, bromoethyl group, trifluoropropyl group; a cyanoethyl group, and the like, without impairing the characteristics of the resins. In particular, it is easy to adjust a resin containing methyl group, phenyl group, trifluoropropyl group, and these resins can be suitably used.

The curable resin composition of the present invention is useful as a coating material for optical use such as light emitting diode, LED device encapsulant. When a curable silicone resin is selected as the main component (X), the compositions exemplified by the following are preferred but the invention is not limited by these.

[Curable Silicone Resin Composition]

Main Component (X)

In the present invention, it is more preferred that the curable silicone resin composition exemplified below is used. For example, the silicone resin composition shown below may be mentioned as the main component (X).

(A) Aliphatic Unsaturated Bond-Containing Organopolysiloxane

Component (A) which is a base component is an organopolysiloxane having two or more aliphatic unsaturated bonds in one molecule, and is essentially linear. The organopolysiloxane preferably has a viscosity at room temperature of 100 mPa·s or more and 10,000 mPa·s or less, more preferably 100 mPa·s or more and 5,000 mPa·s or less in the points of workability, curability, etc.

The molecular structure is essentially linear, preferably linear. Here, "essentially linear" means that all the siloxane units other than the triorganosiloxy group which encapsulates both terminals the present component are mainly constituted by bi-functional unit (D unit) (specifically, the unit represented by the formula: $R^1_2SiO$), but at least one siloxane unit of tri-functional unit (T unit) (specifically, the unit represented by the formula: $R^1SiO_{3/2}$) and tetra-functional unit (Q unit) (specifically, the unit represented by the formula: $SiO_{4/2}$) which constitute a branched structure may be contained in an amount of 3 mol % or less, preferably 2 mol % or less based on the whole siloxane units.

Preferred is a linear diorganopolysiloxane in which both terminals alone are constituted by mono-functional units (M unit) (specifically, unit represented by the formula: $R^1_3SiO_{1/2}$), and other siloxane units are all constituted by the D unit. Here, $R^1$ is a substituted or unsubstituted monovalent hydrocarbon group.

Here, the monovalent hydrocarbon group of $R^1$ is preferably a group having 1 to 10 carbon atoms, particularly having 1 to 6 carbon atoms, specifically, an alkyl group such as methyl group, ethyl group, propyl group, isopropyl group, butyl group, isobutyl group, tert-butyl group, pentyl group, neopentyl group, hexyl group, octyl group, nonyl group, decyl group; a cyclohexyl group; an aryl group such as phenyl group, tolyl group, xylyl group, naphthyl group; an aralkyl group such as benzyl group, phenylethyl group, phenylpropyl group; an alkenyl group such as vinyl group, allyl group, propenyl group, isopropenyl group, butenyl group, pentenyl group, hexenyl group, octenyl group; a cyclohexenyl group; and a group in which a part or whole of the hydrogen atom(s) of these hydrocarbon group has/have been substituted by a halogen atom such as fluorine, bromine, chlorine; a cyano group, and the like, for example, a halogen-substituted alkyl group such as chloromethyl group, chloropropyl group, bromoethyl group, trifluoropropyl group; a cyanoethyl group, and the like.

The organopolysiloxane of Component (A) has two or more aliphatic unsaturated bonds in one molecule. The aliphatic unsaturated bond may be representatively mentioned an alkenyl group and a cycloalkenyl group each having 2 to 8 carbon atoms, particularly 2 to 6 carbon atoms, specifically exemplified by the alkenyl group such as vinyl group, allyl group, propenyl group, isopropenyl group, butenyl group, pentenyl group, hexenyl group; a cycloalkenyl group such as cyclohexenyl group. Among these, preferred are a vinyl group and an allyl group.

Preferred specific example of the organopolysiloxane of Component (A) may be mentioned a linear organopolysiloxane having at least one alkenyl group at each of the silicon atoms at the both terminals of the molecular chain represented by the following formula (1), and having a viscosity at room temperature of preferably 100 mPa·s or more and 10,000 mPa·s or less, more preferably 100 mPa·s or more and 5,000 mPa·s or less,

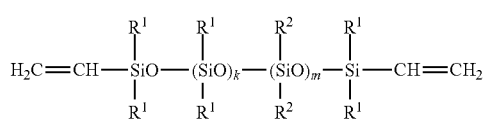

wherein $R^1$s have the same meanings as defined above, and independently represent an unsubstituted or substituted monovalent hydrocarbon group, $R^2$s each represent the same or different unsubstituted or substituted monovalent hydrocarbon group having no aliphatic unsaturated bond, "k" and "m" independently represent 0 or a positive integer and k+m are a number which makes the viscosity of the organopolysiloxane at room temperature 100 mPa·s or more and 10,000 mPa·s or less.

Also, the monovalent hydrocarbon group having no aliphatic unsaturated bond of $R^2$ may be mentioned that having 1 to 10 carbon atoms, particularly having 1 to 6 carbon atoms, and exemplified by those similar to the specific examples of the $R^1$, but an alkenyl group and a cyclohexenyl group are excluded.

"k" and "m" generally represent $0 \le k \le 2,000$ and $1 \le m \le 10,000$, and represent 0 or a positive integer satisfying $1 \le k+m \le 10,000$, preferably an integer satisfying $5 \le k+m \le 2,000$, and $0 \le k/(k+m) \le 0.2$.

The organopolysiloxane represented by the formula (1) may be specifically exemplified by the following compounds.

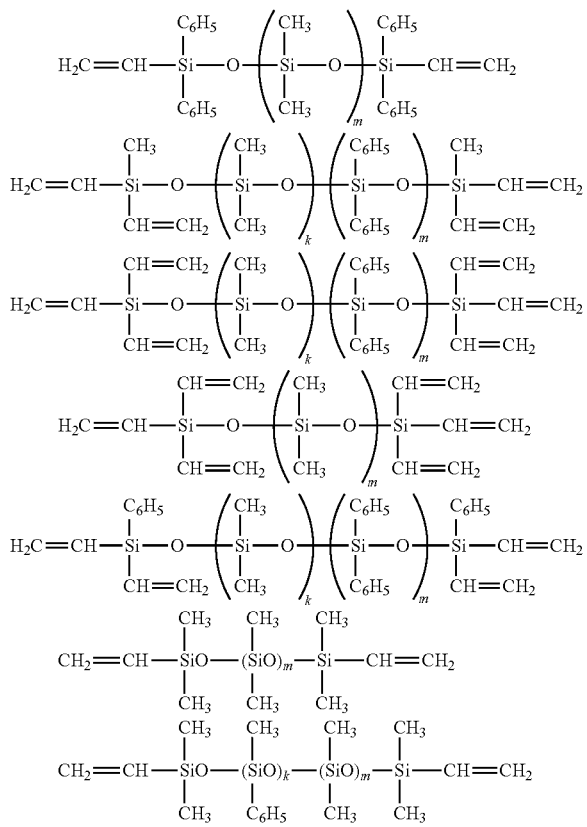

wherein "k" and "m" are as defined above.

More specific examples of the organopolysiloxane of Component (A) are as follows.

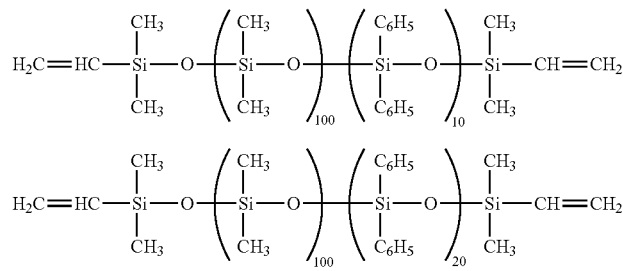

-continued

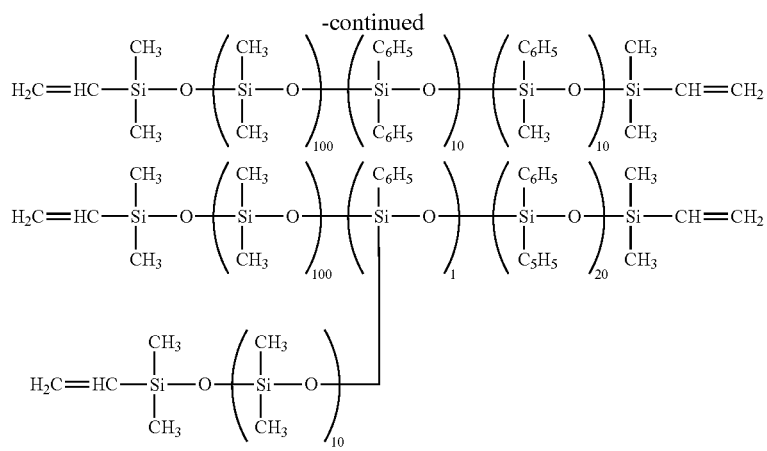

(B) Organopolysiloxane Having Resin Structure

In the present invention, as the organopolysiloxane having an aliphatic unsaturated bond, together with the organopolysiloxane which is essentially linear of Component (A), an organopolysiloxane having a resin structure is used as Component (B).

The organopolysiloxane having a resin structure which has an aliphatic unsaturated group of Component (B) is three-dimensionally crosslinked in advance, and has a three-dimensional network structure. The organopolysiloxane comprises $R^1_3SiO_{1/2}$ unit and $SiO_2$ unit, and may further contain at least one of $R^1SiO_{3/2}$ unit and $R^1_2SiO$ unit in some cases. That is, it basically comprises the $R^1_3SiO_{1/2}$ unit and the $SiO_2$ unit, and the $R^1SiO_{3/2}$ unit and/or the $R^1_2SiO$ unit may be optionally and suitably contained. It preferably comprises the $R^1_3SiO_{1/2}$ unit and the $SiO_2$ unit. Here, $R^1$s may be the same or different from each other, and independently represent a substituted or unsubstituted monovalent hydrocarbon group preferably having 1 to 10 carbon atoms, which is the same as explained in Component (A).

In addition, the organopolysiloxane is suitably a material having a weight average molecular weight in the range of 500 to 10,000.

The organopolysiloxane of Component (B) is different from the organopolysiloxane which is essentially linear of Component (A) in the point of "having a resin structure". In the present specification, the organopolysiloxane of Component (B) "has a resin structure" means that 5 mol % or more, preferably 10 mol % or more, more preferably 15 to 75 mol %, further preferably 25 to 50 mol % based on the whole siloxane unit in the organopolysiloxane resin comprises the $SiO_2$ unit. This unit has a function of making the siloxane skeletal structure of the molecule a three-dimensional network structure.

A preferred organopolysiloxane as the organopolysiloxane having a resin structure of Component (B) basically comprises $SiO_2$ unit (QB unit), $R^3_nR^4_pSiO_{0.5}$ unit (MB1 unit) and $R^3_qR^4_rSiO_{0.5}$ unit (MB2 unit), and may optionally contain a bi-functional siloxane unit and/or a tri-functional siloxane unit (that is, organosilsesquioxane unit) with the ratios as mentioned above (here, $R^3$ represents a vinyl group or an allyl group, $R^4$ represents a monovalent hydrocarbon group containing no aliphatic unsaturated bond, "n" represents 2 or 3, "p" represents 0 or 1, with the relationship of n+p=3, "q" represents 0 or 1, "r" is 2 or 3, with the relationship of q+r=3).

Incidentally, the substituted or unsubstituted monovalent hydrocarbon group containing no aliphatic unsaturated bond of $R^4$ may be mentioned the same groups as those of the $R^2$ having 1 to 10 carbon atoms, in particular having 1 to 6 carbon atoms.

Here, when a molar number of the QB unit is made "q", a molar number of the MB1 unit is made "m1", and a molar number of the MB2 unit is made "m2", it is preferred to satisfy the following relational equations (a) and (b):

$(m1+m2)/q=0.3$ to 3, particularly 0.7 to 1     (a)

$m2/q=0.01$ to 1, particularly 0.07 to 0.15     (b)

Synthesis of the organopolysiloxane having such a resin structure can be easily carried out by combining compounds which become the respective unit sources so that the formed units become a predetermined ratio, and subjecting to co-hydrolysis in the presence of, for example, an acid.

Here, as the QB unit source, there may be exemplified by sodium silicate, alkyl silicate, polyalkyl silicate, silicon tetrachloride, etc.

Also, as the MB1 unit source, the following compounds may be exemplified.

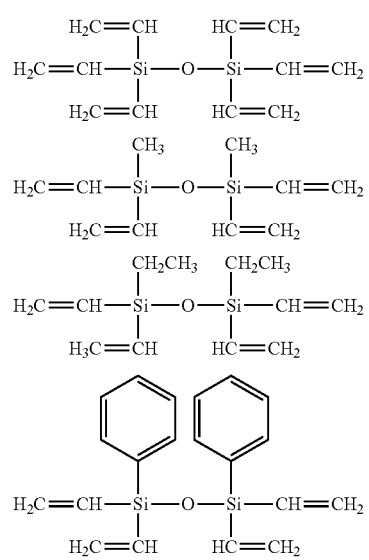

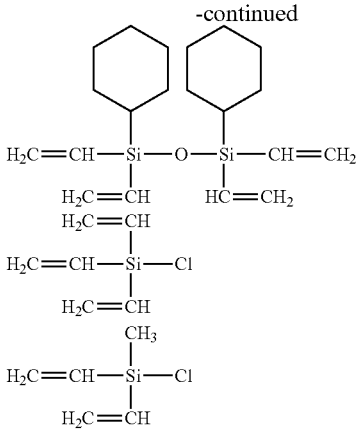

Further, as the MB2 unit source, the following compounds may be exemplified.

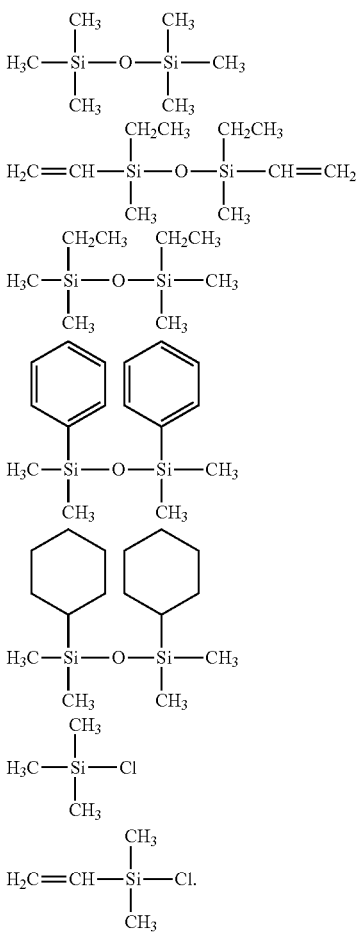

The organopolysiloxane having a resin structure of Component (B) is to be formulated for adjusting the hardness of the resulting cured product, and formulated in an amount of 0.1 to 50% by mass, preferably 1 to 30% by mass based on the total amount of the Component (A) and Component (B) as explained previously. By adjusting the ratio of the Component (B), the hardness can be controlled.

(C) Organohydrogenpolysiloxane

The organohydrogenpolysiloxane of Component (C) acts as a crosslinking agent, and a cured product is formed by the addition reaction of the SiH group in said component and the aliphatic unsaturated group such as alkenyl group, in Component (A) and Component (B). Such an organohydrogenpolysiloxane may be any materials so long as it has two or more hydrogen atoms bonded to the silicon atom (i.e., a SiH group) in one molecule, preferably three or more, particularly 4 to 1,000. The molecular structure is not specifically limited, and any materials which have been conventionally used as a crosslinking agent for addition reaction-curing type silicone compositions. Various kinds of materials, for example, a linear, a cyclic, a branched, or a three-dimensional network structure (a resin state), etc., can be used.

The hydrogen atoms bonded to the silicon atom, which are contained two or more, preferably three or more in one molecule, may be positioned either at the terminal of the molecular chain or at the non-terminal of the molecular chain, or may be positioned at the both of these. A monovalent atom(s) or a substituent(s) bonded to the silicon atom, which are other than the hydrogen atoms, are all having no aliphatic unsaturated bond, and preferably unsubstituted or substituted monovalent hydrocarbon groups bonded to the silicon atom having 1 to 10 carbon atoms.

A number of the silicon atoms of the organohydrogenpolysiloxane in one molecule (i.e., a polymerization degree) is generally desirably 2 to 1,000, preferably 3 to 300, more preferably 4 to 150 or so, and a material which is a liquid state at room temperature (25° C.), i.e., having a viscosity at 25° C. of generally 0.1 to 100,000 mPa·s, preferably 0.5 to 5,000 mPa·s or so, is used.

The organohydrogenpolysiloxane may be used, for example, that represented by the following average compositional formula (2).

$$R^5{}_bH_cSiO_{(4-b-c)/2} \tag{2}$$

wherein $R^5$ represents an unsubstituted or substituted monovalent hydrocarbon group bonded to a silicon atom containing no aliphatic unsaturated bond, preferably having 1 to 10 carbon atoms, "b" represents a number of 0.7 to 2.1, "c" represents a number of 0.001 to 1.0, and b+c is in the range of 0.8 to 3.0.

The unsubstituted or substituted monovalent hydrocarbon group containing no aliphatic unsaturated bond represented by the $R^5$ may be mentioned, for example, an alkyl group such as methyl group, ethyl group, propyl group, isopropyl group, butyl group, isobutyl group, tert-butyl group, pentyl group, neopentyl group, hexyl group, cyclohexyl group, octyl group, nonyl group, decyl group; an aryl group such as phenyl group, tolyl group, xylyl group, naphthyl group; an aralkyl group such as benzyl group, phenylethyl group, phenylpropyl group; a group in which a part or whole of the hydrogen atoms of these hydrocarbon group is/are substituted by a halogen atom(s) such as fluorine, bromine, chlorine, for example, chloromethyl group, chloropropyl group, bromoethyl group, trifluoropropyl group, and the like. Among these unsubstituted or substituted monovalent hydrocarbon groups, preferred are an alkyl group and an aryl group, more preferred are a methyl group and a phenyl group.

Also, it is preferred that "b" represents a number of 1.0 to 2.0, "c" represents a number of 0.01 to 1.0, and b+c is in the range of 1.5 to 2.5.

Such an organohydrogenpolysiloxane can be generally obtained by hydrolyzing a chlorosilane such as $R^5SiHCl_2$, $(R^5)_3SiCl$, $(R^5)_2SiCl_2$ and $(R^5)_2SiHCl$ (where $R^5$ has the same meaning as defined above), or equilibrating the siloxane obtained by hydrolysis.

The organohydrogenpolysiloxane represented by the average compositional formula (2) may be specifically mentioned, for example, 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, methylhydrogensiloxane and dimethylsiloxane cyclic copolymer, both terminals trimethylsiloxy group-encapsulated methylhydrogenpolysiloxane, both terminals trimethylsiloxy group-encapsulated dimethylsiloxane and methylhydrogensiloxane copolymer, both terminals dimethylhydrogensiloxy group-encapsulated dimethylpolysiloxane, both terminals dimethylhydrogensiloxy group-encapsulated dimethylsiloxane and methylhydrogensiloxane copolymer, both terminals trimethylsiloxy group-encapsulated methylhydrogensiloxane and diphenylsiloxane copolymer, both terminals trimethylsiloxy group-encapsulated methylhydrogensiloxane, diphenylsiloxane and dimethylsiloxane copolymer, both terminals trimethylsiloxy group-encapsulated methylhydrogensiloxane, methylphenylsiloxane and dimethylsiloxane copolymer, both terminals dimethylhydrogensiloxy group-encapsulated methylhydrogensiloxane, dimethylsiloxane and diphenylsiloxane copolymer, both terminals dimethylhydrogensiloxy group-encapsulated methylhydrogensiloxane, dimethylsiloxane and methylphenylsiloxane copolymer, a copolymer comprising $(CH_3)_2HSiO_{1/2}$ unit, $(CH_3)_3SiO_{1/2}$ unit and $SiO_{4/2}$ unit, a copolymer comprising $(CH_3)_2HSiO_{1/2}$ unit and $SiO_{4/2}$ unit, and a copolymer comprising $(CH_3)_2HSiO_{1/2}$ unit, $SiO_{4/2}$ unit and $(C_6H_5)_3SiO_{1/2}$ unit, and the like.

More specifically, the hydrogenorganosiloxanes having the structures represented by the following formulae may be exemplified,

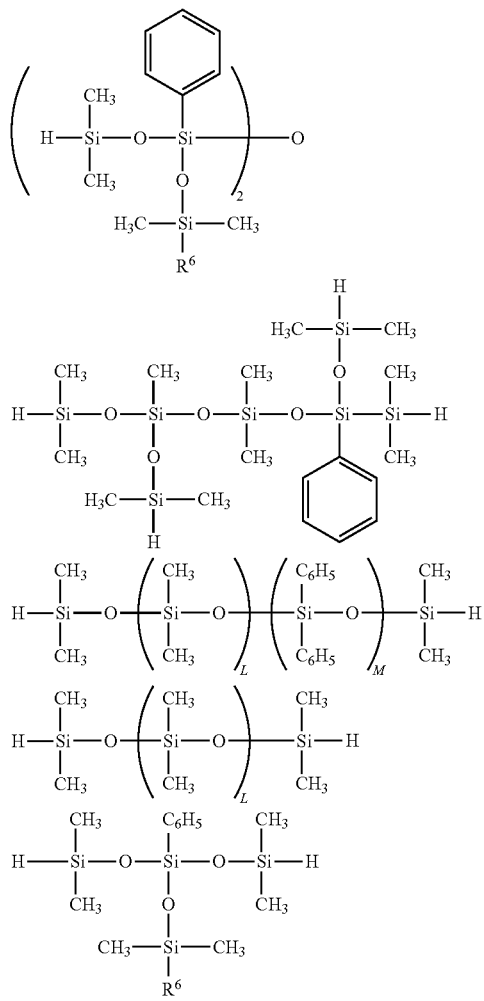
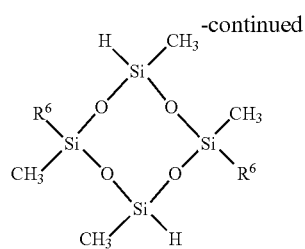

wherein L represents an integer of 0 to 200, M represents an integer of 1 to 200, and $R^6$ represents a functional group-substituted alkyl group containing a functional group selected from an epoxy group, a (meth)acryloxy group, and an alkoxysilyl group.

Incidentally, a formulation amount of the organohydrogenpolysiloxane of Component (C) is an effective amount for curing the Component (A) and Component (B), in particular, the hydrogen atoms bonded to the silicon atom contained therein is preferably 0.8 to 4.0 mol based on 1 mol of the total aliphatic unsaturated group such as alkenyl group, in Component (A) and Component (B), more preferably 1.0 to 3.0 mol, and further preferably 1.0 to 2.0 mol. If the amount of the Component (C) is 4.0 mol or less, it is preferred since there is no possibility of causing change in rubber physical properties with a lapse of time as a result of remaining the unreacted hydrogen atoms bonded to the silicon atom in the cured product with a large amount.

[(D) Platinum Group Metal Catalyst]

The platinum group metal catalyst of Component (D) has a function of causing addition curing reaction of the composition of the present invention. As the catalyst, there are platinum type catalyst, palladium type catalyst, and rhodium type catalyst, and in the viewpoint of a cost, there may be mentioned platinum type catalyst such as platinum, platinum black, chloroplatinic acid, for example, $H_2PtCl_6.mH_2O$, $K_2PtCl_6$, $KHPtCl_6.mH_2O$, $K_2PtCl_4$, $K_2PtCl_4.mH_2O$, $PtO_2.mH_2O$ ("m" represents a positive integer), or a complex of the above with a hydrocarbon such as an olefin, an alcohol or a vinyl group-containing organopolysiloxane. These may be used single kind alone or in combination with two or more kinds.

A formulation amount of Component (D) may be an effective amount as the hydrosilylating catalyst, preferably in the range of 0.1 to 1,000 ppm, more preferably in the range of 1 to 500 ppm in terms of a mass of the platinum group metal element based on the total mass of Components (A) to (C).

[Additive (Y)]

Next, the additive (Y) is shown below. First, from the refractive index of the main component (X) obtained as mentioned above, when the component satisfies the range $|IR_X-IR_Y| \geq 0.0050$ of the refractive index, it can be freely selected depending on the characteristics. Further, the additive (Y) further preferably contains any one component or more of Components (A) to (C) exemplified in the main component (X).

(A) An organopolysiloxane having two or more aliphatic unsaturated bonds in one molecule, which is essentially linear (B) An organopolysiloxane having two or more aliphatic unsaturated bonds in one molecule and having a resinous structure (C) An organohydrogenpolysiloxane having two or more hydrogen atom bonded to a silicon atom in one molecule.

The additive (Y) may be a single component of the (A) to (C), or may by a mixture of Components (A) to (C).

As a preparation example of the single component, for example, the refractive index can be adjusted by changing a content of the functional group contained in the composition constituting the respective components, for example, a kind or a content of the monovalent hydrocarbon group (there may be preferably mentioned those having 1 to 10 carbon atoms, particularly having 1 to 6 carbon atoms, and specifically an alkyl group such as methyl group, ethyl group, propyl group, isopropyl group, butyl group, isobutyl group, tert-butyl group, pentyl group, neopentyl group, hexyl group, octyl group, nonyl group, decyl group; a cyclohexyl group; an aryl group such as phenyl group, tolyl group, xylyl group, naphthyl group, an aralkyl group such as benzyl group, phenylethyl group, phenylpropyl group; an alkenyl group such as vinyl group, allyl group, propenyl group, isopropenyl group, butenyl group, pentenyl group, hexenyl group, octenyl group; a cyclohexenyl group; and a group in which a part or whole of the hydrogen atom(s) of these hydrocarbon group has/have been substituted by a halogen atom such as fluorine, bromine, chlorine; a cyano group, and the like, for example, a halogen-substituted alkyl group such as chloromethyl group, chloropropyl group, bromoethyl group, trifluoropropyl group; a cyanoethyl group, and the like) in the Components (A) to (C), and suitably used without impairing the characteristics.

In particular, preparation of a resin containing a methyl group, a phenyl group, a trifluoropropyl group, etc., is easy and thus such a resin can be suitably used. When an allyl group is contained in the additive (Y), a formulation amount of Component (C) may be optionally adjusted.

Also, a platinum group metal catalyst of the Component (D) may be contained in the additive (Y), and an amount to be added may be in the range clearly mentioned in the main component (X).

Further, the additive (Y) may be a composition which is commercially available as a commercial product. Such a material may be mentioned, for example, when a commercially available silicone resin which gives a refractive index of 1.42 is used as the main component (X), commercially available silicone resins (for example, KER7030 (refractive index: 1.38), KER2500 (refractive index: 1.41), KER6150 (refractive index: 1.44), ASP1031 (refractive index: 1.57), etc., all available from Shin-Etsu Chemical Co., Ltd.) which satisfy the refractive index in the range of $|IR_X-IR_Y|\geq 0.0050$ can be suitably used as the additive (Y). These may be used singly, or may be used in combination of two or more. The same component as the main component (X) may be partially used.

[Phosphor Particles]

The phosphor particles to be added to the curable resin composition of the present invention may be mentioned, for example, a material which absorbs light from a semiconductor light emitting diode having a nitride type semiconductor as a light emitting layer and conducting conversion of a wavelength to light having a different wavelength. For example, it is preferably one or more selected from nitride type phosphor particles and oxynitride type phosphor particles mainly activated by a lanthanoid type element such as Eu, Ce, alkaline earth metal halogen apatite phosphor particles mainly activated by a lanthanoid type element such as Eu, or by a transition metal type element such as Mn, alkaline earth metal borate halogen phosphor particles, alkaline earth metal aluminate phosphor particles, alkaline earth metal silicate phosphor particles, alkaline earth metal sulfide phosphor particles, alkaline earth metal thiogallate phosphor particles, alkaline earth metal silicon nitride phosphor particles, germanate phosphor particles, rare earth aluminate phosphor particles mainly activated by a lanthanoid type element such as Ce, rare earth silicate phosphor particles, organic and organic complex phosphor particles mainly activated by a lanthanoid type element such as Eu, and Ca—Al—Si—O—N type oxynitride glass phosphor particles, etc.

As specific examples, the following mentioned phosphor particles may be used but the invention is not limited by these.

In the nitride type phosphor particles mainly activated by a lanthanoid type element such as Eu, Ce, there may be mentioned $M_2Si_5N_8$:Eu (M represents at least one selected from Sr, Ca, Ba, Mg and Zn), etc. In addition, there may be mentioned $MSi_7N_{10}$:Eu, $M_{1.8}Si_5O_{0.2}N_8$:Eu, $M_{0.9}Si_7O_{0.1}N_{10}$:Eu (M is the same as mentioned above), etc.

In the oxynitride type phosphor particles mainly activated by a lanthanoid type element such as Eu, Ce, there may be mentioned $MSi_2O_2N_2$:Eu (M is the same as mentioned above), etc.

In the alkaline earth halogen apatite phosphor particles mainly activated by a lanthanoid type element such as Eu, or by a transition metal type element such as Mn, there may be mentioned $M_5(PO_4)_3X$:R (M is the same as mentioned above, X represents at least one selected from F, Cl, Br and I, and R represents one or more of Eu, Mn, and Eu and Mn), etc.

In the alkaline earth metal borate halogen phosphor particles, there may be mentioned $M_2B_5O_9X$:R (M is the same as mentioned above, X represents at least one selected from F, Cl, Br and I, and R represents one or more of Eu, Mn, and Eu and Mn), etc.

In the alkaline earth metal aluminate phosphor particles, there may be mentioned $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R represents one or more of Eu, Mn, and Eu and Mn), etc.

In the alkaline earth metal sulfide phosphor particles, there may be mentioned $La_2O_2S$:Eu, $Y_2O_2S$:Eu and $Gd_2O_2S$:Eu, etc.

In the rare earth aluminate phosphor particles mainly activated by a lanthanoid type element such as Ce, there may be mentioned YAG type phosphor particles represented by the compositional formulae $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y,Gd)_3(Al,Ga)_5O_{12}$. In addition, there may be also mentioned $Tb_3Al_5O_{12}$:Ce, $Lu_3Al_5O_{12}$:Ce, etc., which are materials in which a part or whole of Y has been substituted by Tb, Lu, etc.

In the other phosphor particles, there may be mentioned ZnS:Eu, $Zn_2GeO_4$:Mn and $MGa_2S_4$:Eu (M represents at least one selected from Sr, Ca, Ba, Mg and Zn, and X represents at least one selected from F, Cl, Br and I), etc.

The phosphor particles may be, depending on necessity, in place of Eu, or in addition to Eu, contained one or more selected from Tb, Cu, Ag, Au, Cr, Nd, Dy, Co, Ni and Ti.

Also, phosphor particles which are other than the phosphor particles, and having the same properties and effects may be also used.

Incidentally, the Ca—Al—Si—O—N type oxynitride glass phosphor particles are phosphor particles comprising an oxynitride glass as a matrix material, which comprises, in terms of mol %, 20 to 50 mol % of $CaCO_3$ in terms of CaO, 0 to 30 mol % of $Al_2O_3$, 25 to 60 mol % of $SiO$, 5 to 50 mol % of AlN, and 0.1 to 20 mol % of a rare earth oxide or a transition metal oxide, with the total of the five components of 100 mol %.

Incidentally, in the phosphor particles comprising the oxynitride glass as a matrix material, the nitrogen content is preferably 15 wt % or less, and it is preferred that, in addition to the rare earth oxide ions, other rare earth element ions which become a sensitizer with a content in the range of 0.1 to 10 mol % as a rare earth oxide in the fluorescent glass as a co-activator.

[Other Components]

In the composition of the present invention, other optional components may be formulated in addition to the main component (X), the additive (Y), the Components (A), (B), (C) and (D), and the phosphors depending on the purposes. Specific examples thereof may be mentioned the following. These other components may be each used singly, or in combination of two or more kinds.

[Aliphatic Unsaturated Group-Containing Compound Other than Component (A) or (B)]

In the composition of the present invention, an aliphatic unsaturated group-containing compound which can be subjected to addition reaction with Component (C) may be formulated. Such an aliphatic unsaturated group-containing compound may be preferably a material which participates in formation of a cured product, and may be mentioned an organopolysiloxane having at least two aliphatic unsaturated groups in one molecule. The molecular structure thereof may be, for example, any of linear, cyclic, branched chain state, or three-dimensional network, etc.

In the present invention, it is possible to formulate an aliphatic unsaturated group-containing organic compound other than the organopolysiloxane. Specific examples of the aliphatic unsaturated group-containing compound may be mentioned a monomer such as butadiene, a diacrylate derived from a polyfunctional alcohol; a polyolefin such as polyethylene, polypropylene or a copolymer of styrene and other ethylenically unsaturated compound(s) (for example, acrylonitrile or butadiene); an oligomer or a polymer derived from a functional substituted organic compound(s) such as ester of acrylic acid, methacrylic acid, or maleic acid. The aliphatic unsaturated group-containing compound may be a liquid or a solid at the room temperature.

[Addition Reaction Controller]

In the composition of the present invention, an addition reaction controller may be added to the composition of the present invention to ensure pot stability. The addition reaction controller is not particularly limited so long as it is a compound having a curing suppressing effect to the hydrosilylating catalyst of the Component (D), and those conventionally known may be also used. Specific examples thereof may be mentioned a phosphorus-containing compound such as triphenylphosphine; a nitrogen-containing compound such as tributylamine, tetramethylethylenediamine, benzotriazole; a sulfur-containing compound; an acetylene type compound such as acetylene alcohols (for example, 1-ethynylcyclohexanol, 3,5-dimethyl-1-hexyn-3-ol); a compound containing two or more alkenyl groups; a hydroperoxy compound; maleic acid derivatives, etc.

The degree of the curing suppressing effect by the addition reaction controller may vary depending on the chemical structure of the addition reaction controller. Thus, it is preferred to adjust the added amounts of the respective addition reaction controllers to be used to the optimum amounts. By adding an optimum amount of the addition reaction controller, the composition becomes a material excellent in long term storage stability at room temperature and thermosetting property.

[Surfactant]

To the curable resin composition may be added a surfactant for the purpose of controlling the particle size. The surfactant herein mentioned means a compound which can control the particle diameter in a broad sense. By the surfactant being added, the particle diameter of fine particles can be controlled, whereby particles having less than 50 μm can be obtained and the solution can be made stable for a long period of time. The surfactant may be selected within the range which can give a suitable particle size so that a sedimentation preventing effect of the phosphors having various shapes and specific gravities can be obtained in the objective photosemiconductor apparatus.

The surfactant may be used those conventionally known in the art. It is preferably a nonionic surfactant. If ionic impurities are contained in the composition with a small amount, it is preferred since there is no possibility of causing inconveniences.

[Adhesiveness Imparting Component]

The curable resin composition may contain an adhesiveness imparting component to improve adhesiveness. The adhesiveness imparting component may be exemplified by a silane coupling component, its hydrolysis condensate, and a conventionally known adhesion aid, etc. The silane coupling component may be exemplified by conventionally known materials including epoxy group-containing silane coupling component, (meth)acrylic group-containing silane coupling component, isocyanate group-containing silane coupling component, isocyanurate group-containing silane coupling component, amino group-containing silane coupling component, mercapto group-containing silane coupling component, etc.

The adhesion aid may be mentioned, for example, an organooxysilyl-modified isocyanurate compound represented by the formula (3) and/or its hydrolysis condensate (an organosiloxane-modified isocyanurate compound),

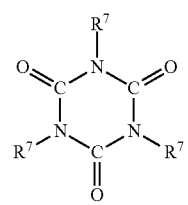

(3)

wherein $R^7$ represents an organic group represented by the following formula (4),

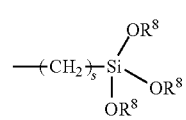

(4)

where $R^8$ represents a hydrogen atom or a monovalent hydrocarbon group having 1 to 6 carbon atoms, and "s" represents an integer of 1 to 6, particularly an integer of 1 to 4, or a monovalent hydrocarbon group containing an aliphatic unsaturated bond, provided that at least one of $R^7$s is/are an organic group(s) represented by the formula (4).

In the formula (3), the monovalent hydrocarbon group containing an aliphatic unsaturated bond represented by $R^7$ may be mentioned an alkenyl group having 2 to 8 carbon atoms, particularly 2 to 6 carbon atoms such as vinyl group, allyl group, propenyl group, isopropenyl group, butenyl group, isobutenyl group, pentenyl group, hexenyl group; and a cyclohexenyl group, etc.

Also, the monovalent hydrocarbon group having 1 to 6 carbon atoms represented by $R^8$ may be mentioned an alkyl group such as methyl group, ethyl group, propyl group, isopropyl group, butyl group, isobutyl group, tert-butyl group, pentyl group, hexyl group; a cyclohexyl group; an alkenyl group such as vinyl group, allyl group, propenyl group, isopropenyl group, butenyl group, isobutenyl group, pentenyl group, hexenyl group; a cyclohexenyl group; an aryl group such as phenyl group, preferably an alkyl group.

As the specific example of the organooxysilyl-modified isocyanurate compound of the general formula (3), the compound represented by the following formulae may be mentioned.

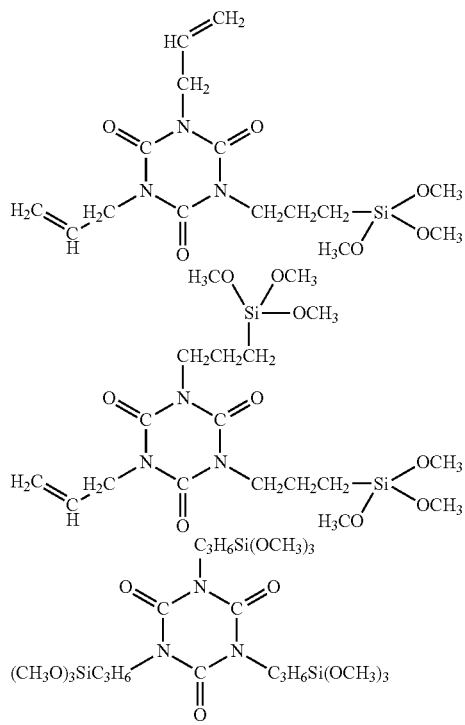

In addition, as the adhesion aid, there may be mentioned organosilicon compound (i.e., an organosilane and an organopolysiloxane) essentially containing an alkoxy group bonded to the silicon atom, as well as having a hydrogen atom bonded to the silicon atom, an alkenyl group bonded to the silicon atom, and/or an epoxy group, and specific examples thereof may be mentioned those represented by the following formulae,

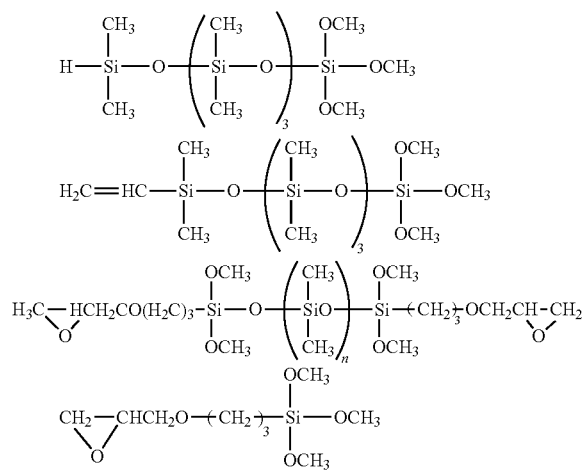

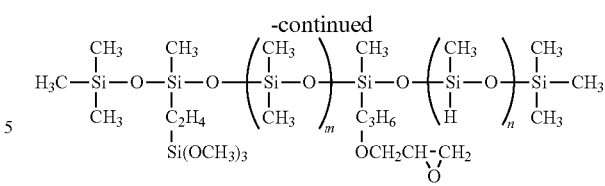

wherein "m" represents an integer of 0 to 50, "n" represents an integer of 0 to 50, provided that m+n satisfy 2 to 50, preferably 4 to 20.

Among such an organosilicon compound, as a compound which is particularly excellent in adhesiveness of the resulting cured product, an organosilicon compound having an alkoxy group bonded to the silicon atom, and an alkenyl group or a hydrogen atom bonded to the silicon atom (SiH group) in one molecule is preferred.

A formulation amount of the adhesiveness imparting component to be used is preferably 0.1 to 20 parts by mass, more preferably 0.3 to 10 parts by mass based on 100 parts by mass of Component (A), Component (B) and Component (C) in total.

[Other Optional Components]

A conventionally known antioxidant such as 2,6-di-t-butyl-4-methylphenol may be formulated to the composition of the present invention to suppress occurrence of coloring and oxidative degradation, etc., of the cured product. Also, a photostabilizer such as a hindered amine type stabilizer may be formulated to the composition of the present invention to provide resistance to photodegradation. Further, depending on the purpose of the cured product obtained from the composition of the present invention, an inorganic filler such as fumed silica, nanoalumina may be formulated to the composition of the present invention for improving strength and suppressing sedimentation of the particles, and depending on necessity, a heat conductive filler, a dye, a pigment, a defoaming component, a leveling component, a light diffusion component, a flame retardant, etc., may be formulated to the composition of the present invention.

[Cured Product]

The curable composition of the present invention can be cured by the conventionally known curing method under the conventionally known conditions. Specifically, the composition can be generally cured by heating at 80 to 200° C., preferably 100 to 160° C. A heating time may be 0.5 minute to 5 hours or so, in particular 1 minute to 3 hours or so, and when precision is required such as for LED encapsulating, etc., the curing time is preferably elongated. A form of the obtainable cured product is not particularly limited, and may be either of, for example, a gel cured product, an elastomer cured product or a resin cured product.

In a photosemiconductor apparatus in which a photosemiconductor chip is encapsulated by the composition of the present invention, the support structure to which the photosemiconductor chip is mounted is not particularly limited, and may be a package, or a supporting substrate with package-less, for example, a ceramics substrate, a silicon substrate, a glass epoxy substrate, a Bakelite (registered trademark) (an epoxy resin) substrate, a metal substrate, etc.

[Photosemiconductor Apparatus]

The cured product of the composition of the present invention is effective for suppressing sedimentation of the phosphor, in particular, it contains the same amount of the phosphor at the initial stage of the manufacturing and at the latter stage of the same in the dispensing process, and is excellent in brightness and stability of color rendering property.

In FIG. 1, an example of a photosemiconductor apparatus 10 using the cured product of the curable resin composition of the present invention is shown. A light-emitting device 3 is wire bonded by a wire 2, an encapsulating resin comprising the curable resin composition of the present invention is coated onto the light-emitting device 3, and the coated encapsulating resin is cured by the conventionally known curing method under the conventionally known conditions, specifically according to the method as mentioned above whereby it can be encapsulated. As the optical device 3 encapsulated by the encapsulant 1 comprising the composition of the present invention, there may be mentioned, for example, an LED, a semiconductor laser, a photodiode, a phototransistor, a solar cell, CCD, etc.

EXAMPLES

In the following, the present invention is specifically explained by referring to Examples and Comparative examples, but the present invention is not limited by the following Examples. Incidentally, in the following examples, symbols showing an average composition of the silicone oil or the silicone resin show the following units. Also, the molar number of each silicone oil or each silicone resin shows a molar number of a vinyl group or a SiH group contained in each component.

$M^H$: $(CH_3)_2HSiO_{1/2}$
M: $(CH_3)_3SiO_{1/2}$
$(CH_2=CH)(CH_3)_2SiO_{1/2}$
$D^H$: $(CH_3)HSiO_{2/2}$
$D^\Phi$: $(C_6H_5)_2SiO_{2/2}$
$D^F$: $(CF_3CH_2-CH_2)CH_3SiO_{2/2}$
D: $(CH_3)_2SiO_{2/2}$
$D^{Vi}$: $(CH_2=CH)(CH_3)SiO_{2/2}$
Q: $SiO_{4/2}$

Main Component Composition (X)

Formulation Example 1

(Component (A)) 35 parts by mass of silicone oil having an average compositional formula: $M^{Vi}_2D_{298}M^{Vi}$
(Component (B)) 65 parts by mass of silicone resin comprising an M unit, an $M^{Vi}$ unit and a Q unit, a molar ratio of the M unit to the $M^{Vi}$ unit of 6.25, and a molar ratio of the sum of the M unit and the $M^{Vi}$ unit to the Q unit of 0.8,
(Component (C)) 8 parts by mass of methylhydrogensiloxane having an average structural formula: $MD^H_{80}M$,
(Component (D)) 0.06 part by mass of a toluene solution containing 1% by mass of chloroplatinic acid/1,3-divinyltetramethyldisiloxane complex in terms of a platinum atom content,
0.05 part by mass of ethynylcyclohexanol, and
3 parts by mass of γ-glycidoxypropyltrimethoxysilane were mixed well to prepare a silicone composition (X)-A. When the refractive index of the composition (X)-A at the room temperature was measured, it was 1.40845.

Formulation Example 2

(Component (A)) 31 parts by mass of silicone oil having an average compositional formula: $M^{Vi}_2D^\Phi_{2.8}$,
(Component (B)) 59 parts by mass of a branched chain organopolysiloxane represented by $(PhSiO_{3/2})_{0.75}[(CH_2=CH)Me_2SiO_{1/2}]_{0.25}$ (property=solid (25° C.)), content of vinyl group bonded to silicon atom=20 mol %, content of phenyl group bonded to silicon atom based on whole organic groups bonded to silicon atoms=50 mol %, weight average molecular weight in terms of standard polystyrene=1600]
(Component (C)) 6.4 parts by mass of methylhydrogensiloxane represented by an average compositional formula: $M^HD^H_2D^\Phi_2M^H$,
(Component (D)) 0.06 part by mass of a toluene solution containing 1% by mass of chloroplatinic acid/1,3-divinyltetramethyldisiloxane complex in terms of a platinum atom content,
0.05 part by mass of ethynylcyclohexanol, and
3 parts by mass of γ-glycidoxypropyltrimethoxysilane were mixed well to prepare a silicone composition (X)-B. When the refractive index of the composition (X)-B at the room temperature was measured, it was 1.55476.

Additive (Y)
[Additive (Y)-a]
Silicone oil having an average compositional formula: $M^{Vi}_{677}D^\Phi_{21}M^{Vi}$ was prepared. When the refractive index of the additive (Y)-a was measured, it was 1.41923.
[Additive (Y)-b]
Silicone oil having an average compositional formula: $M^{Vi}_{628}D^\Phi_{70}M^{Vi}$ was prepared. When the refractive index of the additive (Y)-b was measured, it was 1.44812.
[Additive (Y)-c]
Silicone oil having an average compositional formula: $M^{Vi}_2D^\Phi_{2.8}$ was prepared. When the refractive index of the additive (Y)-c was measured, it was 1.58597.
[Additive (Y)-d]
Silicone oil having an average compositional formula: $M^{Vi}D_{748}M^{Vi}$ was prepared. When the refractive index of the additive (Y)-d was measured, it was 1.40395.
[Additive (Y)-e]
Silicone oil having an average compositional formula: $M^{Vi}D^F_{27}M^{Vi}$ was prepared. When the refractive index of the additive (Y)-e was measured, it was 1.38350.

Example 1

To 100 parts by mass of the composition (X)-A as the main component (X) was added 2 parts by mass of the additive (Y)-a as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 1. Particle diameters of the dispersed fine particles at this time were measured. Further, to 100 parts by mass of the curable resin composition 1 was added 8 parts by mass of a YAG type inorganic phosphor having a specific gravity of 5 g/cm³, and the mixture was uniformly mixed by using a similar rotation/revolution-type centrifugal mixer equipped with a vacuum deaeration mechanism.

Example 2

To 100 parts by mass of the composition (X)-A as the main component (X) was added 2 parts by mass of the additive (Y)-b as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 2. Particle diameters of the dispersed fine particles at this time were measured. Further, to 100 parts by mass of the curable resin composition 2 was added 8 parts by mass of a YAG type inorganic phosphor having a specific gravity of 5 g/cm³, and the mixture was uniformly mixed by using a similar rotation/revolution-type centrifugal mixer equipped with a vacuum deaeration mechanism.

Example 3

To 100 parts by mass of the composition (X)-A as the main component (X) was added 2 parts by mass of the additive (Y)-c as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 3. Particle diameters of the dispersed fine particles at this time were measured. Further, to 100 parts by mass of the curable resin composition 3 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Example 4

To 100 parts by mass of the composition (X)-B as the main component (X) was added 5 parts by mass of the additive (Y)-d as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 4. Particle diameters of the dispersed fine particles at this time were measured. Further, to 100 parts by mass of the curable resin composition 4 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Example 5

To 100 parts by mass of KER2500 (refractive index: 1.4105) available from Shin-Etsu Chemical Co., Ltd., as the main component (X) was added 2 parts by mass of the additive (Y)-b as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 5. Particle diameters of the dispersed fine particles at this time were measured. Further, to 100 parts by mass of the curable resin composition 5 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Example 6

To 100 parts by mass of the composition (X)-B as the main component (X) was added 5 parts by mass of the additive (Y)-e as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 6. Particle diameters of the dispersed fine particles at this time were measured. Further, to 100 parts by mass of the curable resin composition 6 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Example 7

To 100 parts by mass of KER6020 (refractive index: 1.4268) available from Shin-Etsu Chemical Co., Ltd., as the main component (X) was added 5 parts by mass of the additive (Y)-a as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition V. Particle diameters of the dispersed fine particles at this time were measured. Further, to 100 parts by mass of the curable resin composition 7 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Example 8

To 100 parts by mass of KER2500 (refractive index: 1.4105) available from Shin-Etsu Chemical Co., Ltd., as the main component (X) was added 5 parts by mass of KER6020 (refractive index: 1.4268) available from Shin-Etsu Chemical Co., Ltd., as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 8. Particle diameters of the dispersed fine particles at this time were measured. Further, to 100 parts by mass of the curable resin composition 8 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Comparative Example 1

To 100 parts by mass of the composition (X)-A as the main component (X) was added no component corresponding to the additive (Y) to prepare a curable resin composition 9. At this time, particle diameters of the dispersed fine particles were tried to measure, but the particles could not be confirmed. Further, to 100 parts by mass of the curable resin composition 9 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Comparative Example 2

To 100 parts by mass of the composition (X)-B as the main component (X) was added no component corresponding to the additive (Y) to prepare a curable resin composition 10. At this time, particle diameters of the dispersed fine particles were tried to measure, but the particles could not be confirmed. Further, to 100 parts by mass of the curable resin composition 10 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Comparative Example 3

To 100 parts by mass of the composition (X)-A as the main component (X) was added 2 parts by mass of the additive (Y)-d as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 11. Particle diameters of the dispersed fine particles at this time were measured. Further, to 100 parts by mass of the curable resin composition 11 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Comparative Example 4

To 100 parts by mass of the composition (X)-A as the main component (X) was added 150 parts by mass of the additive (Y)-c as the additive (Y), and the mixture was uniformly mixed by using a rotation/revolution-type centrifugal mixer equipped with a vacuum deaeration mechanism (Product name: ARV-310, manufactured by THINKY CORPORATION) to prepare a curable resin composition 12. Particle diameters of the dispersed fine particles at this time were measured. Further, to 100 parts by mass of the curable resin composition 12 was added 8 parts by mass of a YAG type inorganic phosphor having a specific gravity of 5 g/cm$^3$, and the mixture was uniformly mixed by using a similar rotation/revolution-type centrifugal mixer equipped with a vacuum deaeration mechanism.

Figure 2:
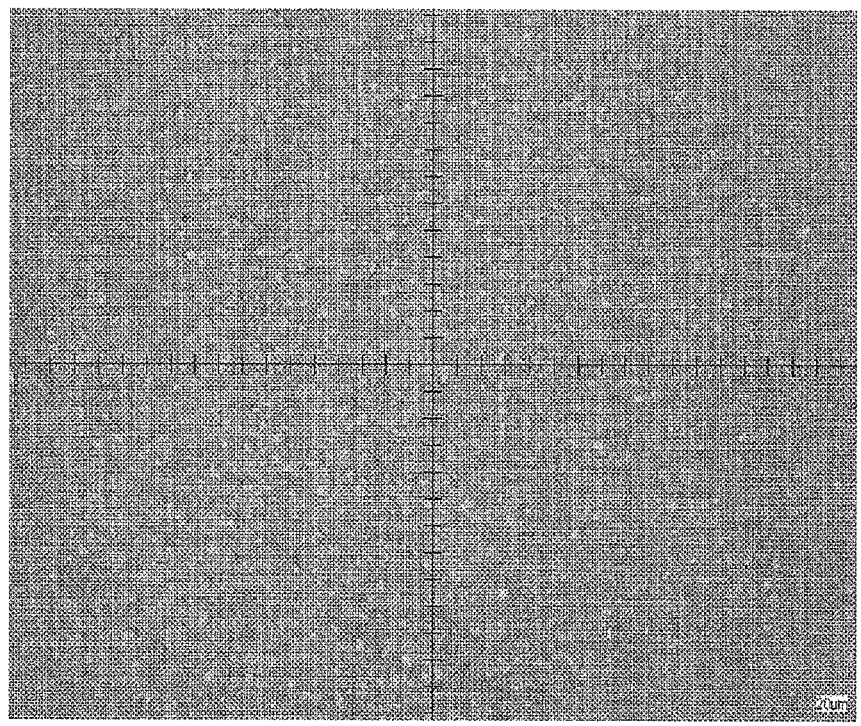
FIG. 2: a photograph of a particle size observed by a laser microscope.

Evaluations of the curable resin compositions (1) to (h) prepared in the Examples and Comparative examples were carried out by the following manner.
[Evaluation Method]
Measurement of Refractive Index By using Abbe's refractometer, measurement of nd25 was carried out.
Measurement of Particle Size Measurement of the particle size was carried out by using a laser microscope VK-9700 manufactured by KEYENCE CORPORATION. A photograph of a particle size observed by a laser microscope is shown in FIG. 2.

A sample in which the main component (X) and the additive (Y) had been mixed under the predetermined conditions was used without dilution. A drop of the sample was coated on a microscope slide glass, and after stabilization, this glass was set to the measurement portion and measured. The measurements were carried out three times with the same manner. The maximum value was obtained among the three times of the measurements of the particle diameter of the fine particles.

Measurement of Haze

Measurement of the haze was carried out by using a haze meter NDH-5000SP manufactured by NIPPON DENSHOKU INDUSTRIES Co., Ltd.

A sample in which the main component (X) and the additive (Y) had been mixed under the predetermined conditions was poured into a cell with a thickness of 2 mm, cured by heating under the predetermined conditions to obtain a cured product with a thickness of 2 mm having a clean surface, and the product was set to the measurement portion and the haze value was measured. The measurements were carried out three times with the same manner. An average value of the haze values of the three times of the measurements was obtained.
Manufacture of Photosemiconductor Package LED chips having a luminous layer comprising InGaN and a main light-emitting peak of 450 nm were each mounted on a SMD5050 package (manufactured by I-CHIUN PRECISION INDUSTRY CO., resin portion: PPA) as photosemiconductor devices and wire bonded, and a light emitting semiconductor apparatus as shown in FIG. 1 was used.

As the encapsulating resin, to 10 g of the curable resin composition prepared in each Example and Comparative example, 1 g of the phosphor was weighed and mixed uniformly, and 5 cc of the mixture was immediately transferred to 10 cc of a syringe for dispensing so as to not affected by sedimentation of the phosphor, coated to the SMD5050 package with a regulated amount without a waiting time, and continuously coated onto a sheet of a lead frame (120 packages), which were made a role of the process. In a role of the process, the lead frame to which the encapsulant had been filled was cut in half, divided into two groups each with 60 packages, and 60 packages of the first group were immediately cured by heating at 150° C. for 4 hours to prepare photosemiconductor packages. Thereafter, the second group was allowed to stand for 24 hours, in the same manner as in the first group, the packages were cured by heating at 150° C. for 4 hours to prepare photosemiconductor packages. Each 10 photosemiconductor apparatuses obtained at the initial stage curing of the coating process (first group) and curing after 24 hours after the coating process (second group) were optionally subjected to sampling.
Measurements of Total Luminous Flux and Color Coordinate (x)

Total luminous flux value (Lm) and color coordinate (x) of the ten photosemiconductor apparatuses obtained by the above process were measured (force current: IF=20 mA) by using a total luminous flux measurement system HM-9100 (manufactured by Otsuka Electronics Co., Ltd.), and average values thereof were measured.

TABLE 1

| | Example | | | | | | | |
|---|---|---|---|---|---|---|---|---|
| | 1 | 2 | 3 | 4 | 5 | 6 | 7 | 8 |
| Main component (X) refractive index | 1.40845 | 1.40845 | 1.40845 | 1.55476 | 1.4105 | 1.55476 | 1.4268 | 1.4105 |
| Additive (Y) refractive index | 1.41923 | 1.44812 | 1.58597 | 1.40395 | 1.44812 | 1.38350 | 1.41923 | 1.4268 |
| $|RI_X - RI_Y|$ | 0.01078 | 0.03967 | 0.17752 | 0.15081 | 0.0376 | 0.17126 | 0.0076 | 0.0163 |
| Maximum diameter of fine particles | 40 μm | 24 μm | 24 μm | 23 nm | 28 nm | 45 μm | 40 μm | 28 μm |

TABLE 1-continued

| | Example | | | | | | | |
|---|---|---|---|---|---|---|---|---|
| | 1 | 2 | 3 | 4 | 5 | 6 | 7 | 8 |
| Haze value of 2 mm cured product | 11.1 | 5.8 | 98.5 | 99.4 | 2.8 | 99.8 | 3.2 | 4.8 |
| Initial total luminous flux value Lm | 7.60 | 7.63 | 7.58 | 7.60 | 7.56 | 7.59 | 7.61 | 7.59 |
| Total luminous flux value Lm after 24 hours | 7.48 | 7.58 | 7.47 | 7.43 | 7.50 | 7.38 | 7.49 | 7.49 |
| Initial color coordinate x | 0.412 | 0.419 | 0.419 | 0.415 | 0.413 | 0.413 | 0.412 | 0.417 |
| Color coordinate x after 24 hours | 0.386 | 0.413 | 0.397 | 0.389 | 0.396 | 0.381 | 0.384 | 0.411 |
| Difference in color coordinate Δx between initial stage and after 24 hours | 0.026 | 0.006 | 0.022 | 0.026 | 0.017 | 0.032 | 0.028 | 0.006 |
| Remarks | | | | | | | | |

TABLE 2

| | Comparative example | | | |
|---|---|---|---|---|
| | 1 | 2 | 3 | 4 |
| Main component (X) refractive index | 1.40845 | 1.55476 | 1.40845 | 1.40845 |
| Additive (Y) refractive index | None | None | 1.40395 | 1.58597 |
| $|RI_X - RI_Y|$ | — | — | 0.00450 | 0.17752 |
| Maximum diameter of fine particles | None | None | None | Measurement impossible |
| Haze value of 2 mm cured product | 0.3 | 0.4 | 0.6 | Separated |
| Initial total luminous flux value Lm | 7.58 | 7.64 | 7.49 | x |
| Total luminous flux value Lm after 24 hours | 7.11 | 7.21 | 7.04 | x |
| Initial color coordinate x | 0.416 | 0.411 | 0.413 | x |
| Color coordinate x after 24 hours | 0.369 | 0.369 | 0.370 | x |
| Difference in color coordinate Δx between initial stage and after 24 hours | 0.047 | 0.042 | 0.043 | |
| Remarks | Phosphor sedimented | Phosphor sedimented | Phosphor sedimented | Composition separated with a lapse of time |

As shown in the above Table 1, in Example 1 to Example 5, each is a curable resin composition in which to 100 parts by mass of the main component (X): (refractive index: $RI_X$) was added an amount which became exceeding 0 part by mass and 100 parts by mass or less of the additive (Y): (refractive index: $RI_Y$), having a different refractive index and dispersed therein, and the difference in the refractive indexes satisfied the range of $|RI_X - RI_Y| \geq 0.0050$ in an uncured state. Also, in the curable resin compositions, existence of the fine particles dispersed with a size of less than 50 μm was confirmed, and the haze values exceeded 1.0. In the thus obtained curable resin compositions, remarkable sedimentation of the phosphor was not observed at the initial stage of the dispensing process after mixing the phosphor and after 24 hours, the differences in the total luminous flux value and the color coordinate (x) were small, that is, color fluctuation is small through the process, whereby good photosemiconductor apparatus could be manufactured.

On the other hand, in Comparative example 1 and Comparative example 2 in which the additive (Y) was not added to the main components (X)-A and (X)-B shown in Example 1 and Example 4, the haze values were less than 1.0 which were both transparent. Further, sedimentation of the phosphor was confirmed, and the differences in total luminous flux value and color coordinate (x) are remarkable through the process and it became dark with a lapse of time.

In Comparative example 3 using the additive (Y)-d which did not satisfy the difference in refractive indexes of the range $|RI_X - RI_Y| \geq 0.0050$ to that of the main component (X)-A, fine particles were not observed in the curable resin composition after mixing and dispersing, and further the haze value was less than 1.0 which was transparent. Further, sedimentation of the phosphor was confirmed, and the differences in total luminous flux value and color coordinate (x) are remarkable through the process and it became dark with a lapse of time.

Also, in Comparative example 4 in which the formulation ratio of the resin composition shown in Example 1 has been changed and 150 parts by mass of the additive (Y)-C has been added to 100 parts by mass of the main component (X)-A, the size of the fine particles in the curable resin composition exceeded 50 μm after mixing and dispersing, a part of which became a phase separation state, so that it could not be handled as a good curable resin composition.

It must be stated here that the present invention is not restricted to the embodiments shown by the embodiments. The embodiments are merely examples so that any embodiments composed of substantially the same technical concept as disclosed in the claims of the present invention and expressing a similar effect are included in the technical scope of the present invention.

What is claimed is:

1. A curable resin composition adaptable for forming an encapsulant comprising:
   100 parts by mass of a main component (X) having a refractive index: $RI_X$ and comprising a silicone resin which comprises:
   (A) an organopolysiloxane having two or more aliphatic unsaturated bonds in one molecule and being linear,
   (B) an organopolysiloxane having two or more aliphatic unsaturated bonds in one molecule and having a resinous structure,
   (C) an organohydrogenpolysiloxane having two or more hydrogen atoms bonded to a silicon atom in one molecule, and
   (D) a platinum group metal catalyst, and
   exceeding 0 part by mass and 100 parts by mass or less of an additive (Y) having a refractive index: $RI_Y$ and containing at least one of a silicone resin, a modified silicone resin, an epoxy resin and a modified epoxy resin, and having a different refractive index from that of the main component (X) being added and dispersed therein, in fine particulate state liquid drops
   wherein the difference of the refractive indexes of the main component (X) and the additive (Y) being $|RI_X - RI_Y| \geq 0.0050$ in an uncured state.

2. The curable resin composition according to claim 1, wherein additive (Y) is present in an amount of 20 parts by mass or less based on 100 parts by mass of main component (X).

3. The curable resin composition according to claim 1, wherein the additive (Y) contained in the curable resin composition has a particle size thereof is less than 50 μm.

4. The curable resin composition according to claim 3, wherein a haze value of a cured product of the curable resin composition with a thickness of 2 mm is 1.0 or more, and the product has an appearance of from semi-transparent to cloudiness.

5. The curable resin composition according to claim 4, wherein the additive (Y) is a silicone resin, and the silicone resin comprises at least one component of:
   (A) an organopolysiloxane having two or more aliphatic unsaturated bonds in one molecule and being linear,
   (B) an organopolysiloxane having two or more aliphatic unsaturated bonds in one molecule and having a resinous structure, and
   (C) an organohydrogenpolysiloxane having two or more hydrogen atoms bonded to a silicon atom in one molecule.

6. The curable resin composition according to claim 4, wherein phosphor particles are added to the curable resin composition.

7. The curable resin composition according to claim 6, wherein the curable resin composition does not contain any filler.

8. The curable resin composition according to claim 3, wherein the additive (Y) is a silicone resin, and the silicone resin comprises at least one component of:
   (A) an organopolysiloxane having two or more aliphatic unsaturated bonds in one molecule and being linear,
   (B) an organopolysiloxane having two or more aliphatic unsaturated bonds in one molecule and having a resinous structure, and
   (C) an organohydrogenpolysiloxane having two or more hydrogen atoms bonded to a silicon atom in one molecule.

9. The curable resin composition according to claim 3, wherein phosphor particles are added to the curable resin composition.

10. The curable resin composition according to claim 9, wherein the curable resin composition does not contain any filler.

11. The curable resin composition according to claim 1, wherein a haze value of a cured product of the curable resin composition with a thickness of 2 mm is 1.0 or more, and the product has an appearance of from semi-transparent to cloudiness.

12. The curable resin composition according to claim 11, wherein the additive (Y) is a silicone resin, and the silicone resin comprises at least one component of:
    (A) an organopolysiloxane having two or more aliphatic unsaturated bonds in one molecule and being linear,
    (B) an organopolysiloxane having two or more aliphatic unsaturated bonds in one molecule and having a resinous structure, and
    (C) an organohydrogenpolysiloxane having two or more hydrogen atoms bonded to a silicon atom in one molecule.

13. The curable resin composition according to claim 11, wherein phosphor particles are added to the curable resin composition.

14. The curable resin composition according to claim 13, wherein the curable resin composition does not contain any filler.

15. The curable resin composition according to claim 1, wherein the additive (Y) is a silicone resin, and the silicone resin comprises at least one component of:
    (A) an organopolysiloxane having two or more aliphatic unsaturated bonds in one molecule and being linear,
    (B) an organopolysiloxane having two or more aliphatic unsaturated bonds in one molecule and having a resinous structure, and
    (C) an organohydrogenpolysiloxane having two or more hydrogen atoms bonded to a silicon atom in one molecule.

16. The curable resin composition according to claim 1, wherein phosphor particles are added to the curable resin composition.

17. The curable resin composition according to claim 16, wherein the curable resin composition does not contain any filler.

18. A cured material which comprises the curable resin composition according to claim 15 being cured.

19. A photosemiconductor apparatus which comprises the cured product according to claim 18.

* * * * *